(12) United States Patent
Terhune, IV et al.

(10) Patent No.: US 7,819,688 B2
(45) Date of Patent: Oct. 26, 2010

(54) INTEGRATED SOCKET CLIP WITH ROTATION CONTROL TABS

(75) Inventors: Albert Harvey Terhune, IV, Chandler, AZ (US); Darrell Wertz, Chandler, AZ (US); Ming-Lun Szu, Tu-cheng (TW); David Gregory Howell, Gilbert, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 63 days.

(21) Appl. No.: 12/290,218

(22) Filed: Oct. 28, 2008

(65) Prior Publication Data

US 2010/0105225 A1 Apr. 29, 2010

(51) Int. Cl.
*H01R 13/62* (2006.01)
(52) U.S. Cl. ...................................... 439/331
(58) Field of Classification Search .................. 439/71, 439/73, 331–333, 342, 296; 16/268; 220/810, 220/824, 831
See application file for complete search history.

(56) References Cited

U.S. PATENT DOCUMENTS

| | | | | |
|---|---|---|---|---|
| 6,869,303 B1 * | 3/2005 | Ma | ............................ | 439/331 |
| 6,905,357 B2 | 6/2005 | Ma | | |
| 7,128,593 B2 * | 10/2006 | Ma | ............................ | 439/331 |
| 7,351,087 B2 | 4/2008 | Szu | | |
| 7,438,580 B1 * | 10/2008 | Aoki et al. | .................. | 439/331 |
| 2006/0191948 A1 * | 8/2006 | Wisniewski et al. | ......... | 220/831 |

\* cited by examiner

*Primary Examiner*—Edwin A. Leon
*Assistant Examiner*—Vanessa Girardi
(74) *Attorney, Agent, or Firm*—Andrew C. Cheng; Wei Te Chung; Ming Chieh Chang

(57) ABSTRACT

A socket adapted for electrically connecting an IC package and a PCB, comprising: a body mounted on the PCB for electrically connecting the IC package, a holder mounted on the PCB and beside the body and a clip for retaining the IC package in the body. The clip has two hook portions by which the clip pivotally assembles to the holder. The hook portion has an arched portion and a tab extending from the arched portion, the tab can abut against the holder to prevent the clip from over-rotation.

15 Claims, 4 Drawing Sheets

US 7,819,688 B2

INTEGRATED SOCKET CLIP WITH ROTATION CONTROL TABS

BACKGROUND OF THE INVENTION

1. Field of the Invention

The present invention relates to a socket, especially to an LGA (Land Grid Array) socket mounted to a printed circuit board and adapted for electrically connecting a semiconductor package.

2. Description of the Related Art

U.S. Pat. No. 6,905,357, issued to Honhai on Jun. 14, 2005 discloses a related LGA socket for electrically connecting an IC package to a printed circuit board. The socket includes a stiffener, an insulative housing located in the stiffener and fixed on the printed circuit board, a clip rotatablely assembling to an end of the stiffener to cover the insulative housing, and a load lever pivotally assembling to the other end of the stiffener. The insulative housing defines a plurality of passageways receiving terminals therein. The load lever includes an operational arm, two pivot axles having an offset pressing portion therebetween, and a handle portion. When the chip rotates downwardly to cover the insulative housing, then the load lever is operated to downwardly move, the offset pressing portion presses the clip to lock the clip in a close position. The clip has two hooks by which the clip assembles to the stiffener and a tab between the hooks for preventing the chip from over-rotation.

Another U.S. Pat. No. 7,351,087, issued to Honhai on Apr. 1, 2008 discloses another related socket. The socket includes a socket body having a number of terminals embedded therein. A stiffener is bottomed to the socket body. A load plate and a load lever are pivotally assembled to two opposite ends of the stiffener. The load plate is designed in U-shape to reduce a product cost, and each arm of the load plate is formed with a hook to assemble to the stiffener. However, this type hook can not make the load plate keep in an open position, that is not friendly to operator.

Hence, an improved socket is required to overcome the disadvantages of the prior art.

SUMMARY OF THE INVENTION

An object of the invention is to provide a socket with a U-shape clip having an improved hook.

To achieve the above-mentioned object, a socket adapted for electrically connecting an IC package, comprising: a body formed with an insulative housing, a holder mounted beside the body and a clip. The clip defines an open position and a close position relative to the body and has at least one hook portion which pivotally assembles the clip to the holder. The hook portion has an arched portion and a tab extending from the arched portion, the tab abuts against the holder to prevent the clip from over-rotation during a rotation of the clip.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
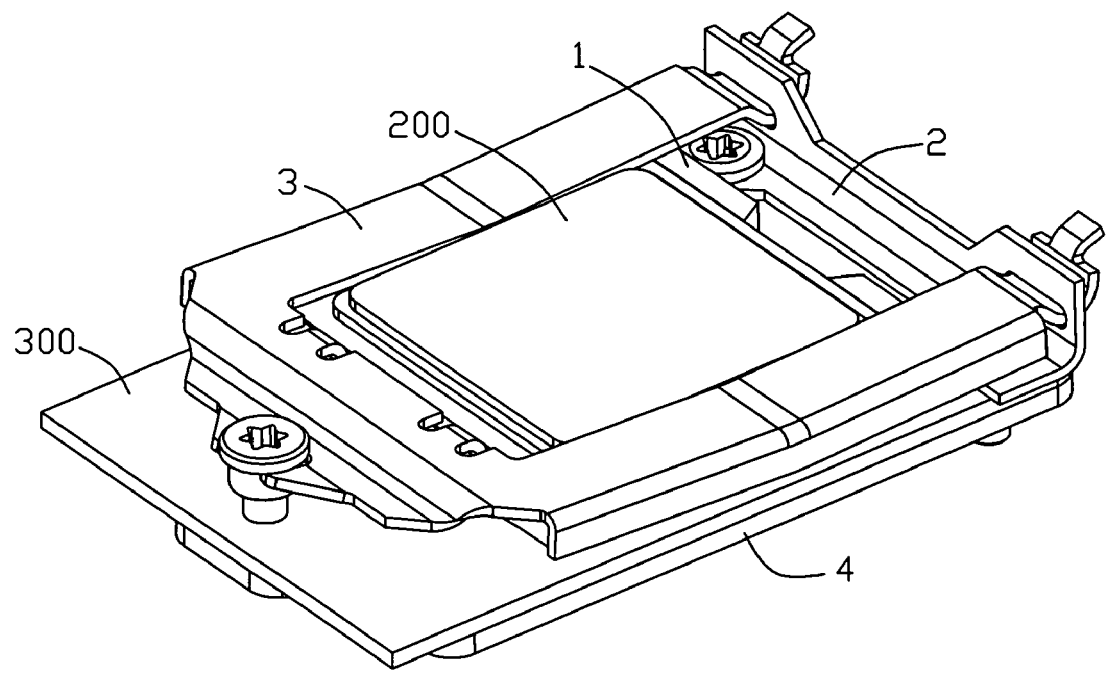
FIG. 1 is an assembled, perspective view of a socket in accordance with a preferred embodiment of present invention.
Figure 2:
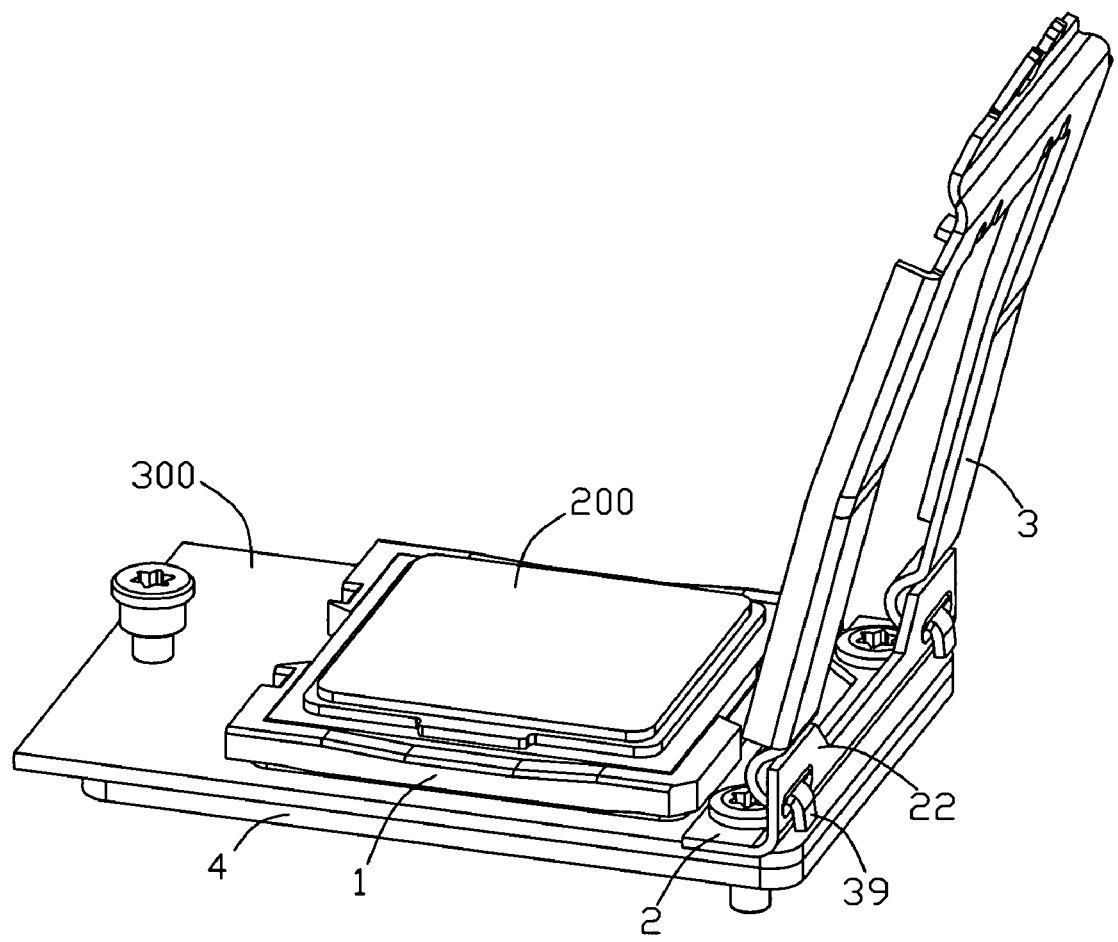
FIG. 2 is another assembled, perspective view of the socket shown in FIG. 1, wherein the socket is in an open position.

Referring to FIGS. 1-2, a socket in accordance with a preferred embodiment of present invention is disclosed for electrically connecting an IC package 200 to a PCB (printed circuit board) 300. The socket has a body 1 mounted to the PCB 300, a holder 2 mounted to the PCB and beside the body 1, a clip 3 pivotally assembling to the holder 2 and adapted to cover the body 1 and retain the IC package 200 in the body 1, and a backplane 4 mounted below the PCB 300.

Figure 3:
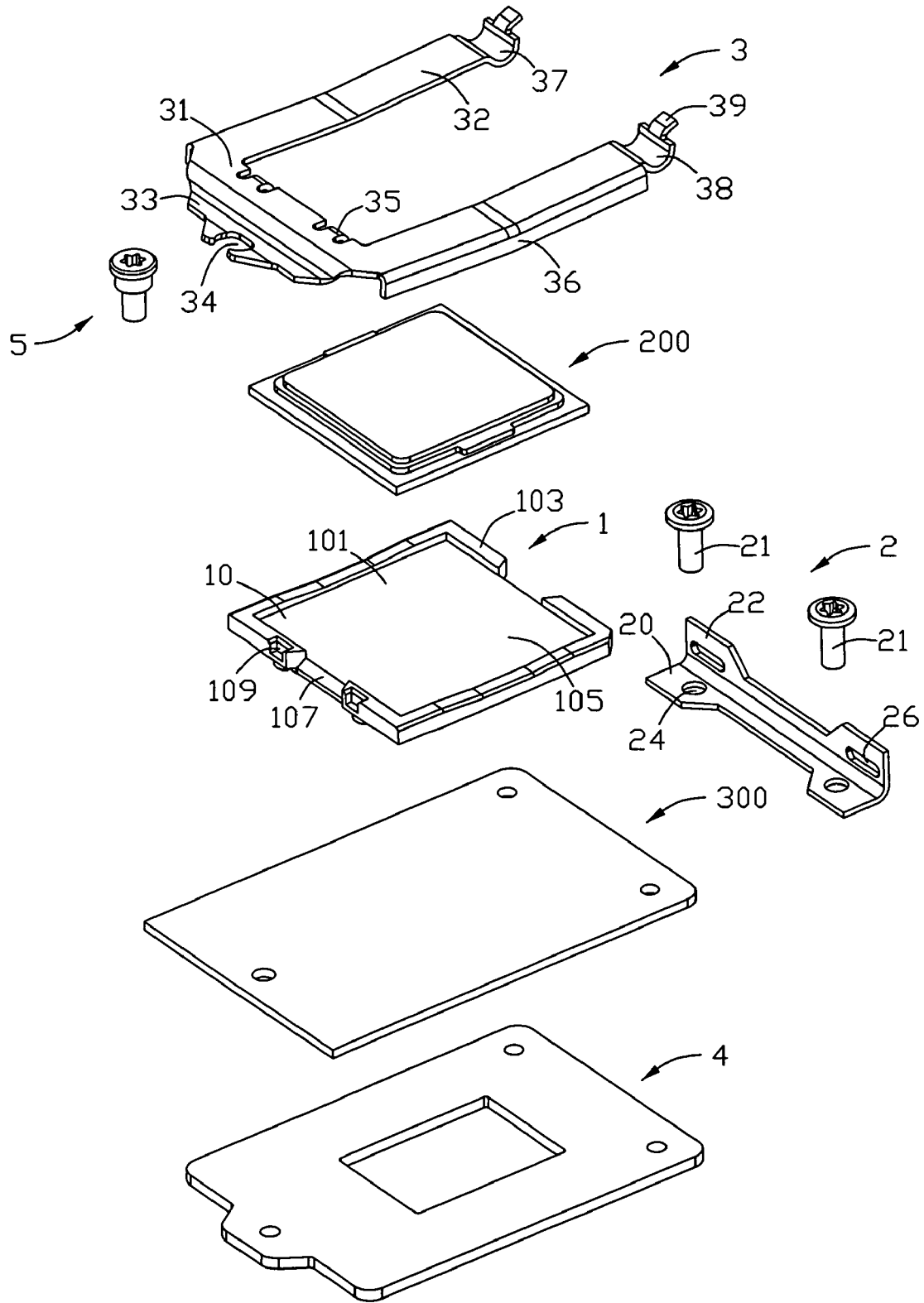
FIG. 3 is an exploded, perspective view of the socket shown in FIG. 1.
Figure 4:
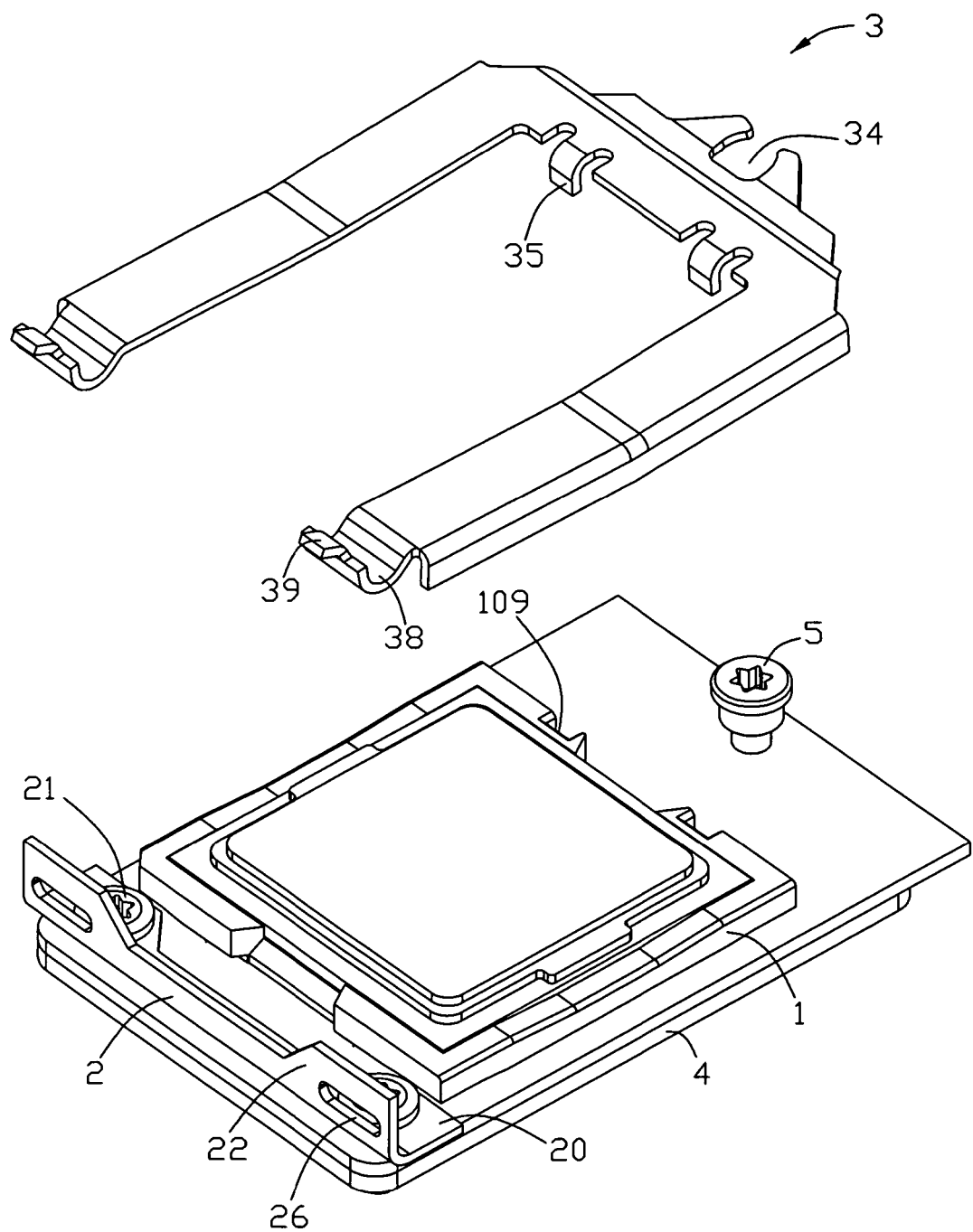
FIG. 4 is a partially assembled, perspective view of the socket in FIG. 1.

Referring to FIGS. 3-4, the body 1 includes a rectangle insulative housing 10 and a plurality of terminals (not shown) received in the insulative housing 10 for electrically contacting with the IC package 200 and the PCB 300, respectively. The insulative housing 10 has a bottom wall 101 and four sidewalls 103 surround a peripheral of the bottom wall 101, the bottom wall 101 and the sidewalls 103 together define a receiving space 105 for the IC package 200. Two opposite sidewalls 103 correspondingly define a pair of cutouts 107, and one of the opposite sidewall 103 further defines a pair of recesses 109 inwardly recessed from an out side surface of the sidewall 103 and located on two sides of the cutout 107. Another two sidewalls 103 have substantially downwardly arc top surfaces.

The holder 2 is stamped from a metal piece and mounted on the CPB 300 beside the body 1. The holder 2 is substantially in I-shaped before being bent along an upright center line thereof at 90 degree and has a mounting portion 20 mounted on the PCB 300 and an engaging portion 22 vertical with the mounting portion 20. The mounting portion 20 defines two mounting holes 24 on two opposite ends thereof for passing through of two screws 21 to mount the holder 2 to the PCB 300. The engaging portion 22 defines two slots 26 on two opposed ends thereof. The holder 2 mounts to the PCB 300 by the screw 21 in a manner of the center line of the holder 2 parallel with one of the sidewall 103 which is close the holder 2.

The clip 3 is stamped from metal piece and in a U-shape. The clip 3 has a front edge 31 and two lateral edges 32 extending from the front edge 31. The front edge 31 has a tongue 33 forwardly extending and defining a retaining gap 34. The front edge 31 further has two projections 35 downwardly bent from an inner side of the front edge 31 opposed to the tongue 33. Each of the lateral edge 32 has a side piece 36 downwardly extending to cover corresponding sidewall 103 of the insulative housing 10. Each lateral edge 32 further has a hook portion 37 on a free end thereof which inserts into the slot 26 of the holder 2 to pivotally assemble the clip 3 to the holder 2 to cover the body 1. The hook portion 37 has an arched portion 38 linking with the lateral edge 32 and a tab 39 substantially horizontally extending from the arched portion 38.

Conjoined with FIGS. 1-2, for the tab 39 is line-shape and the slot 26 is narrow, the hook portion 37 need be positioned in a certain angle relative to the engaging portion 22 of the holder 2, so that the tail 39 can easily insert into and pass through the slot 26, and then bring the arched portion 38 inserting into the slot 26, for the same reason, the clip 3 only can be remove from the holder 2 in such certain angle, so the clip 3 can be prevent from detaching from the assembly by mistake in virtue of the tab 39.

The backplane 4 is mounted to a bottom surface of the PCB 300 by the screws 21 and a retainer 5 passing through corresponding holes (not labeled) on the backplane 4, the PCB 3, the mounting holes 24 and the retaining gap 34.

The clip 3 pivotally assembles to the holder 2 and defines an open position and a close position relative to the body 1. The tab 39 of the hook portion 37 abuts against the engaging portion 22 to prevent the clip 3 from over-rotation during a rotation of the clip 3 and keep the clip 3 be the open position. When the clip 3 rotates to the close position, a retainer 5 passes through the gap 34 and mounts to the PCB 300 to retain clip 3, and the projections 35 of the clip 3 engage with the recesses 109 of the body 1.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket adapted for electrically connecting an integrated circuit (IC) package, comprising:
   a body, formed with an insulative housing;
   a holder mounted beside the body and defining two slots; and
   a clip defining an open position and a close position relative to the body and having at least one hook portion which pivotally assembles the clip to the holder, the hook portion having an arched portion and a tab extending from the arched portion, the tab passing through the slot of the holder and abutting against the holder to prevent the clip from rotating substantially beyond a perpendicular position with respect to the body during a rotation of the clip.

2. The socket as described in claim 1, wherein the clip is U-shaped, having a front edge and two lateral edges extending from the front edge, and at least one hook portion extends from a free end of each lateral edge, respectively.

3. The socket as described in claim 2, wherein the front edge further has two projections downwardly bent from an inner side of the front edge opposed the tongue, the insulative housing defines two recesses for engaging with the projections of the clip.

4. The socket as described in claim 2, wherein the holder is stamped from metal piece and has a mounting portion and an engaging portion vertical with the mounting portion, the engaging portion defines the two slots, the hook portion of the clip inserts into the slot and pivotally assembles the clip to the holder.

5. The socket as described in claim 4, wherein the body has a plurality of terminals received in the body, the insulative housing defines a receiving space for receiving the IC package.

6. The socket as described in claim 4, wherein the front edge of the clip has a tongue forwardly extending and defining a retaining gap into which a retainer passes through.

7. A socket adapted for electrically connecting an integrated circuit (IC) package to a printed circuit board (PCB), comprising:
   a body mounted on the PCB for electrically connecting the IC package;
   a holder mounted beside the body and defining two slots; and
   a clip pivotally assembled to the holder to cover the body, the clip being U-shaped and having a front edge and two lateral edges, each lateral edge formed with a hook portion on a free end thereof which has an arched portion and a tab extending from the arched portion, the tab passing through the slot of the holder and abutting against the holder to prevent the clip from rotating substantially beyond a perpendicular position with respect to the body during a rotation of the clip.

8. The socket as described in claim 7, wherein the front edge has a tongue forwardly extending and defining a retaining gap for a retainer passing through to assemble to the PCB and retain the clip.

9. The socket as described in claim 7, wherein the front edge further has two projections downwardly bent from an inner side of the front edge opposed the tongue, the body defines two recesses for engaging with the projections of the clip.

10. The socket as described in claim 7, wherein the holder is stamped from metal piece and has a mounting portion mounted on the PCB and an engaging portion being vertical with the mounting portion and defining the two slots, the hook portions of the clip inserts into the slots and pivotally assembles the clip to the holder.

11. The socket as described in claim 10, wherein the body has an insulative housing and a plurality of terminals received in the insulative housing, the insulative housing defines a receiving space for receiving the IC package.

12. An electrical connector assembly comprising:
   a printed circuit board;
   an insulative housing seated upon the printed circuit board and defining opposite front and rear ends and a receiving space intimately located between the opposite front and rear ends in a front-to-back direction for receiving an integrated circuit (IC) package therein;
   a metallic holder mounted upon the printed circuit board by the rear end of the housing; and
   a metallic clip defining one end pivotally mounted to the holder and the other end fastened to the printed circuit board via a screw by the front end of the housing; wherein
   said clip defines a curved section extending through a slot in said holder for rotation of said clip with regard to the holder, and
   a tab extends from an edge of the curved section and abuts against the holder limiting rearward rotation when said clip is fully rotated to a substantially-perpendicular position; wherein
   said clip further defines at least one downwardly extending tab received in a notch, which is located around said front end and beside said receiving space and provides lateral restriction to the downwardly extending tab, for aligning said clip with regard to the housing in said front-to-back direction.

13. The electrical connector assembly as claimed in claim 12, wherein said tab is essentially aligned with a center line of said curved section in a front-to-back direction.

14. The electrical connector assembly as claimed in claim 12, wherein the insulative housing has a bottom wall and four sidewalls surround a peripheral of the bottom wall, the bottom wall and the sidewalls together define the receiving space, the notch is defined on the sidewall.

15. The electrical connector assembly as claimed in claim 12, wherein the notch is separated with the receiving space.

* * * * *